(12) United States Patent
Lub et al.

(10) Patent No.: US 10,756,241 B2
(45) Date of Patent: Aug. 25, 2020

(54) SILOXANE LIGANDS TO BE USED FOR DISPERSING QUANTUM DOTS IN SILICONE HOSTS TO OBTAIN COLOR CONVERTERS FOR LED LIGHTING

(71) Applicant: Lumileds LLC, San Jose, CA (US)

(72) Inventors: Johan Lub, Valkenswaard (NL); Patrick John Baesjou, Eindhoven (NL); Marcel Rene Bohmer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 526 days.

(21) Appl. No.: 15/327,610

(22) PCT Filed: Jul. 21, 2015

(86) PCT No.: PCT/EP2015/066617
§ 371 (c)(1),
(2) Date: Jan. 19, 2017

(87) PCT Pub. No.: WO2016/012433
PCT Pub. Date: Jan. 28, 2016

(65) Prior Publication Data
US 2017/0222097 A1 Aug. 3, 2017

(30) Foreign Application Priority Data

Jul. 22, 2014 (EP) ..................... 14177940

(51) Int. Cl.
*H01L 33/00* (2010.01)
*H01L 33/50* (2010.01)
(Continued)

(52) U.S. Cl.
CPC .......... *H01L 33/502* (2013.01); *C08G 77/388* (2013.01); *C08K 11/00* (2013.01);
(Continued)

(58) Field of Classification Search
None
See application file for complete search history.

(56) References Cited

U.S. PATENT DOCUMENTS 5,698,494 A 12/1997 Klintz et al.
6,284,906 B1 9/2001 Paulasaari et al.
(Continued)

FOREIGN PATENT DOCUMENTS

CN 1323399 A 11/2001
CN 1399657 A 2/2003
(Continued)

OTHER PUBLICATIONS

Office Action dated Nov. 1, 2018, Taiwan Patent Application No. 104123742, 14 pages.
(Continued)

*Primary Examiner* — Reema Patel

(57) ABSTRACT

The invention provides a luminescent material comprising wavelength converter nanoparticles (120) with siloxane polymer capping ligands (130) associated to the wavelength converter nanoparticles (120), wherein the siloxane polymer capping ligands (130) comprise siloxane polymers which comprise at least one capping group comprising a terminal carboxylic acid group, wherein the capping group comprises in total at least six carbon atoms.

15 Claims, 6 Drawing Sheets

(51) Int. Cl.
*C09K 11/02* (2006.01)
*C09K 11/88* (2006.01)
*C08L 83/08* (2006.01)
*C08G 77/388* (2006.01)
*C08K 11/00* (2006.01)
*C09K 11/08* (2006.01)
*C08G 77/26* (2006.01)
*B82Y 20/00* (2011.01)
*B82Y 40/00* (2011.01)

(52) U.S. Cl.
CPC ............ *C08L 83/08* (2013.01); *C09K 11/025* (2013.01); *C09K 11/08* (2013.01); *C09K 11/883* (2013.01); *H01L 33/507* (2013.01); *B82Y 20/00* (2013.01); *B82Y 40/00* (2013.01); *C08G 77/26* (2013.01); *C08K 2201/001* (2013.01); *C08K 2201/011* (2013.01); *H01L 33/501* (2013.01); *Y10S 977/774* (2013.01); *Y10S 977/783* (2013.01); *Y10S 977/892* (2013.01); *Y10S 977/95* (2013.01)

(56) References Cited

U.S. PATENT DOCUMENTS

| | | | |
|---|---|---|---|
| 6,737,496 | B2 | 5/2004 | Hodd et al. |
| 9,701,897 | B2 | 7/2017 | Xu et al. |
| 2010/0276638 | A1 | 11/2010 | Liu et al. |
| 2011/0240960 | A1 | 10/2011 | Kim et al. |
| 2015/0284627 | A1 | 10/2015 | Bohmer et al. |
| 2015/0291876 | A1 | 10/2015 | Koole et al. |

FOREIGN PATENT DOCUMENTS

| | | |
|---|---|---|
| CN | 104105739 A | 10/2014 |
| TW | 201422765 A | 6/2014 |
| TW | 201425394 A | 7/2014 |
| WO | 2008063653 A1 | 5/2008 |
| WO | 2009035657 A1 | 3/2009 |
| WO | 2010014198 A1 | 2/2010 |
| WO | 2013078309 A1 | 5/2013 |
| WO | 2013114254 A1 | 8/2013 |
| WO | 2014064555 A1 | 5/2014 |
| WO | 2014064620 A1 | 5/2014 |

OTHER PUBLICATIONS

"Photometric Quantities" and "Transmission of Corning Colored Filters", CRC Handbook of Chemistry and Physics, 69th Edition (1988-1989), pp. E-208 and E-406.

Lee, et al. "Synthesis of 5-(7-hydroxyhept-3-enyl)-1,2-dithiolan-3-one 1-oxide, a core functionality of antibiotic leinamycin", Tetrahedron 59 (2003), pp. 833-839.

Extended European Search Report dated Nov. 11, 2014, European Patent Application No. 14177940.5, 11 pgs.

An Qiufeng, et al. "Structure, Morphology and Performance of a Filmy Polysiloxane Compound", Acta Polymerica Sinica, Oct. 1, 2010, pp. 1225-1230 (English abstract on p. 1230).

CN First Office Action dated Oct. 16, 2018, China Patent Application No. 201580051080.6, 23 pages.

EPO as ISA, "International Search Report and Written Opinion" dated Oct. 14, 2015 from International Application No. PCT/EP2015/066617, filed Jul. 21, 2015, 20 pages.

"Glutaric Acid and Glutarimide", Organic Syntheses, vol. 37, Jan. 1957, p. 47.

Meng et al., "Cyclization of the Acyl Glucuronide Metabolite of a Neutral Endopeptidase Inhibitor to an Electrophilic Glutarimide: Synthesis, Reactivity, and Mechanistic Analysis", Journal of Medicinal Chemistry, vol. 50, No. 24, Jun. 11, 2007, pp. 6165-6176.

2a, x=2
2b, x=4
2c, x=5
2d, x=6

US 10,756,241 B2

SILOXANE LIGANDS TO BE USED FOR DISPERSING QUANTUM DOTS IN SILICONE HOSTS TO OBTAIN COLOR CONVERTERS FOR LED LIGHTING

CROSS-REFERENCE TO RELATED APPLICATIONS

The present application is a § 371 application of International Application No. PCT/EP2015/066617 filed on Jul. 21, 2015 and entitled "SILOXANE LIGANDS TO BE USED FOR DISPERSING QUANTUM DOTS IN SILICONE HOSTS TO OBTAIN COLOR CONVERTERS FOR LED LIGHTING," which claims the benefit of European Patent Application No. 14177940.5 filed on Jul. 22, 2014. International Application No. PCT/EP2015/066617 and European Patent Application No. 14177940.5 are incorporated herein.

FIELD OF THE INVENTION

The invention relates to a luminescent material, especially based on quantum dots. The invention further relates to a wavelength converter comprising such luminescent material. Further, the invention relates to a capping ligand that can be used in such luminescent material as well as to a method to make such quantum dot as well as such luminescent material.

BACKGROUND OF THE INVENTION

The use of nano particles, such as quantum dots (QD), for lighting applications is known in the art. US20110240960, for instance, describes a light emitting device comprising a light emitting source, a first quantum dot wavelength converter disposed above the light emitting source, the first quantum dot wavelength converter comprising a plurality of first quantum dots for generating wavelength-converted light by converting wavelength of light from the light emitting source, a first dispersive medium embedding the first quantum dots dispersively therein, and a first sealer for sealing the entire outside surface of dispersive medium embedding the first quantum dots in a pack.

A first encapsulant is applied for encapsulating the entire outside surface of the first quantum dot wavelength converter. Further, a second quantum dot wavelength converter is disposed above the first quantum dot wavelength converter, the second quantum dot wavelength converter comprising a plurality of second quantum dots for generating wavelength-converted light by converting wavelength of light from the light emitting source, a second dispersive medium embedding the second quantum dots dispersively therein, and a second sealer for sealing the entire outside surface of the second dispersive medium embedding the second quantum dots in a pack, wherein the first quantum dot wavelength converter, the second quantum dot wavelength converter and the light emitting source are spaced apart from each other. The second encapsulant is deposited on the entire outside surface of the second quantum dot wavelength converter and for encapsulating the entire outside surface of the second quantum dot wavelength converter. Further, the light emitting source is a light emitting diode or a laser diode.

WO2014/064555 provides a process for the production of a wavelength converter containing a siloxane polymer matrix with wavelength converter nano particles embedded therein, the process containing (a) mixing (i) a first liquid containing (i1) short chain siloxane polymers and (i2) wavelength converter nano particles having an outer surface grafted with siloxane grafting ligands and (ii) curable siloxane polymers, and (b) curing the curable siloxane polymers, thereby producing the wavelength converter(100); wherein the short chain siloxane polymers have s1 Si backbone elements, wherein the siloxane grafting ligands comprise siloxane grafting ligands having x1 Si backbone elements, wherein at least one Si backbone element of each siloxane grafting ligand comprises a group having a grafting functionality; and wherein the curable siloxane polymers have y1 Si backbone elements, wherein $x1/s1 \geq 0.8$, $s1 < y1$ and wherein $x1 < y1$.

WO2014/064620 provides a process for the production of a light converter comprising a siloxane polymer matrix with light converter nano particles embedded therein, the process comprising (a) mixing (i) light converter nano particles having an outer surface grafted with grafting ligands and (ii) curable siloxane polymers, and (b) curing the curable siloxane polymers, thereby producing the light converter; wherein the grafting ligands comprise siloxane grafting ligands having x1 Si backbone elements, wherein at least one Si backbone element of each siloxane grafting ligand comprises a side group having a grafting functionality; wherein the curable siloxane polymers have y1 Si backbone elements; and wherein x1 is at least 20, wherein y1 is at least 2, and wherein $x1/y1 \geq 0.8$.

SUMMARY OF THE INVENTION

Nano particles, such as quantum dots (QDs), have shown to be highly interesting in lighting applications. They could e.g. serve as inorganic phosphor(s) in converting blue light to other colors and have the advantage of a relative narrow emission band and the advantage of color tunable by the size of the QDs to be able to obtain high quality pure white light. In order to use QDs for LED applications they need to be incorporated in a suitable matrix. A QD powder (without matrix) is in general not desired because of both concentration quenching effects and poor processability of such a pure QD powder. Up to now, embedding of nano particles in many types of polymers appears to lead to aggregation of the nano particles. Currently, acrylic matrices are mostly used as a matrix for QDs, but they are known for their poor stability towards high blue light fluxes. We consider silicones the most preferred matrix for QDs because of the proven stability of silicones towards high blue fluxes (i.e. their proven compatibility with LEDs).

Silicones are currently used as standard matrix/resin for many LED-manufacturing processes. However, QDs generally have a hydrophobic organic coating (in the form of ligands, generally extending from the outer surface of the QD) which make them incompatible with silicones: generally a turbid mixture is obtained when QDs are mixed with silicones caused by agglomeration of the QDs.

Unfortunately, many of the commercially obtained quantum dots do not disperse well in silicones but agglomerate. This agglomeration leads to quenching and fast degradation. The quantum dot native ligands are normally derived from aliphatic hydrocarbon compounds (such as oleic acid). Herein, it is proposed to exchange these native ligands by ligands that are compatible with silicones. Thereby, the quantum dots can be homogeneously dispersed in the silicone material. With the presently proposed ligands, surprisingly high QE luminescent materials can be provided, such as e.g. when the quantum dots with the ligands are dispersed in an (inorganic) matrix, especially a silicone matrix. Silicone (matrices) may have an organic character and/or an inorganic character, and are for the sake of simplicity herein in general indicated as inorganic (matrices). Hence, waveguides or light guides can be provided wherein the quantum dots have high quantum efficiencies, whereas in prior art solutions the quantum efficiencies of QDs in matrices are in general surprisingly low when compared to the native QD QE efficiencies.

Hence, it is an aspect of the invention to provide a luminescent material, especially based on quantum dots, that preferably further at least partly obviates one or more of above-described drawbacks. It is also an aspect of the invention to provide an alternative wavelength converter comprising such luminescent material, which preferably further at least partly obviates one or more of above-described drawbacks. Yet, it is also an aspect of the invention to provide an alternative capping ligand that can be used in such luminescent material as well as to a method to make such quantum dot as well as such luminescent material, which preferably further at least partly obviate one or more of above-described drawbacks.

In a first aspect, the invention provides a luminescent material comprising wavelength converter nanoparticles with siloxane polymer capping ligands (herein also indicated as siloxane polymer grafting ligands") associated to the wavelength converter nanoparticles, wherein the siloxane polymer capping ligands comprise siloxane polymers which comprise at least one capping group comprising a terminal carboxylic acid group (—C(O)OH) or —COOH), wherein the capping group especially comprises in total at least three, such as at least four, like at least five, especially at least six carbon atoms. Hence, the total number of carbon atoms in the capping group is equal to or more than 3. Hence, the capping group can be defined as —$R_a$COOH, wherein $R_a$ comprises a hydrocarbon, optionally including one or more heteroatoms. Especially, $R_a$ includes one or more —($CH_2$)— groups, even more especially at least 5 carbon atoms, yet even more especially at least 5 —($CH_2$)— groups, thereby providing a capping group with in total at least 7 carbon atoms (including the carbon atom of the acid group). Especially, the capping group —$R_a$COOH includes one nitrogen atom as hetero atom. Further, especially $R_a$ is linear. $R_a$ is coupled to a Si atom of the siloxane, especially a non-terminal Si atom. Especially, the total number of carbon atoms in the capping group is equal to or less than 20 carbon atoms, such as equal to or less than 12 carbon atoms, with the capping group especially being a linear capping group.

It appears that such quantum dots may have a high QE in both aqueous and non-aqueous systems. It further appears that such quantum dots may provide good dispersions in aqueous systems, substantially without agglomeration. Further, it appears that these type of QDs may well be embedded in, especially silicone, matrices, leading to wavelength converters that are stable and have a high quantum efficiency, much more stable and/or with a much higher QE then when the original QDs with organic ligands were tried to be embedded in a silicone matrix.

The luminescent material may in an embodiment comprise a liquid comprising said quantum dots with capping agent coordinating to the quantum dots. This luminescent material may be a solution, with the QDs substantially (completely) dissolved. However, the luminescent material may also be a dispersion or colloid or gel. Applications of such luminescent material may include lighting application wherein the luminescent material is enclosed in a vessel or cuvette like body or another envelope. However, the luminescent material when dissolved in an aqueous liquid may also be used for biological applications, including medical applications, for instance as biomarkers. Other options include photovoltaic applications or photodiode applications.

In yet another embodiment, the luminescent material substantially comprises the QDs with the capping agents per se. For instance, the QDs may be separated from the liquid with techniques known in the art, including evaporation of the liquid, etc., thereby providing the QDs (including capping) agents as powder or cake. Subsequently, the thus obtained material may be further processed (see also below) into e.g. particulate material. For instance, the luminescent material may also be provided as coating on a substrate. The luminescent material substantially comprising the QDs with the capping agents per se may also be encapsulated in a matrix (see also below), such as an inorganic or organic matrix, to provide e.g. a wavelength converter element.

The quantum dots or luminescent nanoparticles, which are herein indicated as wavelength converter nanoparticles, may for instance comprise group II-VI compound semiconductor quantum dots selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of CuInS$_2$, CuInSe$_2$, CuGaS$_2$, CuGaSe$_2$, AgInS$_2$, AgInSe$_2$, AgGaS$_2$, and AgGaSe$_2$. In yet a further embodiment, the luminescent nanoparticles may for instance be I-V-VI2 semiconductor quantum dots, such as selected from the group consisting of LiAsSe$_2$, NaAsSe$_2$ and KAsSe$_2$. In yet a further embodiment, the luminescent nanoparticles may for instance be a group IV-VI compound semiconductor nano crystals such as SbTe. In a specific embodiment, the luminescent nanoparticles are selected from the group consisting of InP, CuInS$_2$, CuInSe$_2$, CdTe, CdSe, CdSeTe, AgInS$_2$ and AgInSe$_2$. In yet a further embodiment, the luminescent nanoparticles may for instance be one of the group II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS. In an embodiment, however, Cd-free QDs are applied. In a specific embodiment, the wavelength converter nano-particles comprise III-V QDs, more specifically an InP based quantum dots, such as a core-shell InP—ZnS QDs. Note that the terms "InP quantum dot" or "InP based quantum dot" and similar terms may relate to "bare" InP QDs, but also to core-shell InP QDs, with a shell on the InP core, such as a core-shell InP—ZnS QDs, like a InP—ZnS QDs dot-in-rod.

The luminescent nanoparticles (without coating) may have dimensions in the range of about 1-50 nm, especially 1-20 nm, such as 1-15 nm, like 1-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 5-15 nm). The term "dimensions" especially relate to one or more of length, width, and diameter, dependent upon the shape of the nanoparticle. In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1-50 nm, especially 1 to about 20 nm, and in general at least 1.5 nm, such as at least 2 nm. In an embodiment, nanoparticles have an average particle size in a range from about 1 to about 20 nm.

Typical dots may be made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, (spherical) particles such as CdSe, InP, or CuInSe$_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. For instance, core-shell particles and dots-in-rods may be applied and/or combinations of two or more of the afore-mentioned nano particles may be applied, such as CdS and CdSe. Here, the term "different types" may relate to different geometries as well as to different types of semiconductor luminescent material. Hence, a combination of two or more of (the above indicated) quantum dots or luminescent nano-particles may also be applied.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material. In an embodiment, the shell can be chosen so as to have an atomic spacing close to that of the "core" substrate. In certain other embodiments, the shell and core materials can have the same crystal structure. Examples of semiconductor nanocrystal (core)shell materials include, without limitation: red (e.g., (CdSe)ZnS (core)shell), green (e.g., (CdZnSe)CdZnS (core)shell, etc.), and blue (e.g., (CdS)CdZnS (core)shell (see further also above for examples of specific wavelength converter nanoparticles, based on semiconductors.

Hence, the above-mentioned outer surface may be the surface of a bare quantum dot (i.e. a QD not comprising a further shell or coating) or may be the surface of a coated quantum dot, such as a core-shell quantum dot (like core-shell or dot-in-rod), i.e. the (outer) surface of the shell. The grafting ligand thus especially grafts to the outer surface of the quantum dot, such as the outer surface of a dot-in-rod QD.

Therefore, in a specific embodiment, the wavelength converter nanoparticles are selected from the group consisting of core-shell nano particles, with the cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In general, the cores and shells comprise the same class of material, but essentially consist of different materials, like a ZnS shell surrounding a CdSe core, etc.

The term wavelength converter refers to a system that is configured to convert light from a first wavelength into light of a second wavelength. Especially, UV and/or blue light (excitation wavelength) may be (at least partially) converted into (visible) light of higher wavelength than the excitation wavelength. This will further be elucidated below.

Silicones, more precisely called polymerized or polymerizable siloxanes or polysiloxanes, are mixed inorganic-organic polymers with the chemical formula $[(R_1,R_2)SiO]_n$ (not taking into account the terminal groups), where R is a group such as for example hydrogen, hydrocarbon or fluorocarbon, especially methyl, ethyl, or phenyl. Especially, one or more R groups of one or more Si backbone elements comprise one or more of hydrocarbon and fluorocarbon. One or more of these side groups may also have cross-linking functionality, such as a vinyl group or a hydride group. These polymerized siloxanes or polysiloxanes materials consist of an inorganic silicon-oxygen backbone ( . . . —Si—O—S—O—Si—O— . . . ) with organic side groups attached to the silicon atoms, which are four-coordinate. As the R side groups may in principle be different, instead of the formula $[(R_2)SiO]_n$ also the formula $[(R_1,R_2)SiO]_n$ (not taking into account the terminal groups), might be applied. Note that herein x1 and y1 are applied for the number of Si elements in the siloxane backbone for the siloxane grafting ligands and (curable) siloxane polymers (that form the host material), respectively. Likewise, s1 is herein used for the number of Si elements in the siloxane backbone of the short chain siloxane(s) (S polymers). Especially, the backbone of a polymer is the series of covalently bonded atoms that together create the continuous chain of the molecule. For instance, $[(R_2)SiO]_n$ has n Si backbone elements and n O backbone elements. The fact that herein only R, or more precisely, $R_1,R_2$ are mentioned, does not exclude that different Si backbone elements may comprise the same side groups, but also more than two different types of side groups may be comprised by the silicone. Hence, R may for instance, but not limited to, be selected from the group consisting of methyl, phenyl, etc. Also halogens, mainly chlorine, are possible as side compound R. Further, [R$_2$SiO], or [—Si(R)$_2$—O—] refers to the silicone unit or silicone characterizing group (i.e. group that characterizes a silicone).

A siloxane is any chemical compound composed of units of the form R$_2$SiO, where R is for instance, but not limited to, a hydrogen atom, a hydrocarbon group, or one or more R$_2$SiO unit(s) combined with a terminal group. Siloxanes can have branched or unbranched backbones consisting of alternating silicon and oxygen atoms —Si—O—Si—O— with side chains R attached to the silicon atoms. Polymerized siloxanes with organic side chains (R≠H) are commonly known as silicones or as polysiloxanes. Herein, these are also indicated as "siloxanes" or "siloxane polymers". Representative examples are $[SiO(CH_3)_2]_n$ (polydimethylsiloxane) and $[SiO(C_6H_5)_2]_n$ (polydiphenylsiloxane). These compounds can be viewed as a hybrid of both organic and inorganic compounds. The organic side chains confer hydrophobic properties while the —Si—O—Si—O— backbone is purely inorganic. As indicated above, Si elements in the backbone are herein also indicated as Si backbone elements. Hence, any siloxane characterizing moiety R$_2$SiO provides one silicon backbone element (which has two side groups). Note that e.g. PDMS is $CH_3[Si(CH_3)_2O]_nSi(CH_3)_3$, has n+1 Si elements, thus in fact n+1 Si backbone elements. Would such siloxane be used as grafting ligand, x1=n+1; would such siloxane be used as siloxane polymer for curing, y1=n+1. Further, PDMS (see formula) has n−1 non-terminal Si backbone elements. In case mixtures of siloxanes are applied, such as in the case of polydisperse siloxanes, s1, x1, and y1 may especially be averaged values, especially weight averaged values, respectively. Instead of the term "backbone" also the term "siloxane chain" may be used.

By varying the —Si—O— chain lengths, side groups, and cross linking, silicones can be synthesized with a wide variety of properties and compositions. They can vary in consistency from liquid to gel to rubber to hard plastic. The most common siloxane is linear polydimethylsiloxane (PDMS; see above), a silicone oil. The second largest group of silicone materials is based on silicone resins, which are formed by branched and cage-like oligosiloxanes. Herein, especially linear siloxanes are used as curable siloxane polymers and/or siloxane grafting ligands and/or short chain siloxane polymers. However, also non-linear siloxanes may be used as curable siloxane polymers and/or siloxane grafting ligands. Further, as the siloxanes are cured, in general the wavelength converter will be a solid wavelength converter (solid polymeric wavelength converter). Nevertheless, the wavelength converter might in an embodiment be flexible.

As indicated above, the siloxane grafting ligands comprise siloxane grafting ligands having x1 Si backbone elements; especially, the grafting ligands are siloxane grafting ligands (having x1 Si backbone elements). The term "grafting ligand" refers to a ligand that coordinates to or is bound to the outer surface of a wavelength converter nano particle (these particles are further elucidated below), such as quantum dots. Grafting ligands are e.g. known in the art, and are for instance described in WO/2009/035657, WO/2010/014198 and WO/2008/063653, etc. Grafting ligands are sometimes also indicated as capping ligands. The grafting ligands comprise siloxane molecules, which will in general have the commonly known side groups, but also have at least one group, especially at least one side group, having a grafting functionality. The (side) group having a grafting functionality may be selected from the group consisting of an amine and a carboxylate. For instance, the amine can be —NH$_2$ or COOH, but may also be —R—NH$_2$ or R—COOH, respectively, wherein R is a hydrocarbon, preferably comprising less than 20 carbon atoms. However, the (side) group having grafting functionality may also comprise a phosphine, a phosphine oxide, a phosphate, a thiol, etc. (and in an embodiment combinations of two or more thereof). Hence, the grafting ligands are siloxane molecules, which will in general have the commonly known (side) groups, but also have at least one (side) group having a grafting functionality selected from the group consisting of an amine, a carboxylate, a phosphine, a phosphine oxide, a phosphate, a thiol, even more especially an amine, a carboxylate, a phosphine, a phosphine oxide, and a phosphate. The ligand may in an embodiment comprise a plurality of (side) groups having a grafting functionality, which may comprise different types of such (side) groups (or which may be all identical). A Si backbone element may also comprise two (or more) (side) groups having a grafting functionality.

The phrase "side group having a grafting functionality" refers to a side group (not a terminal group) which has the ability to graft to a luminescent nano particle, as describe herein. Therefore, the (side) group having grafting functionality provides to the siloxane its grafting ability (and thus grafting ligand functionality). The one or more groups with grafting functionality are preferably side groups (see also below), though optionally one or more of such one or more groups with grafting functionality may also be end groups (or terminal groups). Hence, especially the side group is a (side) group of a non-terminal Si backbone element (see also below). Therefore, in other words, the grafting ligand especially comprises a non-terminal functional group at least having grafting functionality.

The amine may be grafted as amine to the outer surface of the luminescent nano particle; the carboxylate may be grafted as carboxylate to the luminescent nano particle. Especially, it appears that the functional groups should especially be arranged as side groups and not as end groups. Hence, especially, the grafting ligands comprise siloxane molecules that have end groups which do not comprise a group selected from the group consisting of an amine, a carboxylate, a phosphine, a phosphine oxide, a phosphate, and a thiol; i.e. not having end groups which (substantially) have grafting functionality. The siloxane grafting ligands have especially (side) groups with grafting functionality for the herein indicated semiconductor quantum dots, especially the herein indicated CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs nanoparticles, even more especially the sulfides, tellurides and selenides.

The (side) groups having a grafting functionality may be arranged anywhere over the siloxane backbone of the grafting ligand. Assuming a linear siloxane with x1 silicon backbone units, then especially the one (or more) (side) group(s) having grafting functionality are found between 20-80% of the backbone length. Assuming for instance the backbone comprising 50 Si backbone elements, especially the (side) group having grafting functionality is found on Si no. 10, or Si no. 40 or in between (with no's 1 and 50 being end groups). As indicated above, there is at least one such (side) group, though optionally there may be more than one (side) groups having a grafting functionality such as selected from the group consisting of an amine and a carboxylate, or others, such as a phosphine, a phosphine oxide, a phosphate, a thiol. The number of such (side) groups having a grafting functionality may depend upon the chain length of the siloxane grafting ligand, but especially does not exceed the number of 10, especially not more than 4, such as 1-2. Hence, especially not more than up to 10 Si backbone elements (not being terminal Si backbone elements) of each siloxane grafting ligand comprise a (side) group having a grafting functionality. Especially not more than up to 10 Si backbone elements (not being terminal Si backbone elements) of each siloxane grafting ligand comprise a (side) group (having a grafting functionality) selected from the group consisting of an amine comprising side group, a carboxylate comprising (side) group, a phosphine comprising (side) group, a phosphine oxide comprising (side) group, a phosphate comprising (side) group, and a thiol comprising (side) group. When more than one side group having a grafting functionality is present, especially the percentage of (side) groups having a grafting functionality is equal to or less than 5 mole % (of all $R_1$, R backbone side groups, not more than 5% comprises such functional group), even more especially the percentage of (side) groups having a grafting functionality is equal to or less than 2.5 mole %. Hence, assuming e.g. 22 Si backbone elements (thus including two terminal Si backbone elements), there are 40 (side) groups available; when 5% of them would have grafting functionality, this would imply that up to two (side) groups would have grafting functionality; the others would have no grafting functionality, such as methyl, phenyl, etc.

Note that the terms "grafting ligand" or "siloxane grafting ligand" may also refer to a plurality of different types of siloxane grafting ligands. In an embodiment, these siloxane grafting ligands are substantially identical. However, in another embodiment, the siloxane grafting ligands may comprise a plurality of different siloxane grafting ligands, such as a carboxylate and a phosphate. For instance, they may differ in chain length (x1 (see below)), and/or they may differ in side groups, and/or they may differ in side groups having a grafting functionality, and/or may differ in the number of side groups having a grafting functionality and/or may differ in the position of side groups having a grafting functionality (and/or differ in the type of end groups). For instance, the siloxane grafting ligands may comprise a plurality of siloxane polymers, each having only one (amine) side group, but wherein the position of the (amine) side group is randomly distributed over the siloxane polymers. The term "capping ligand" or "capping element" may also refer to a plurality of different capping ligands. Hence, the term "a capping ligand" is used to indicate that there is at least one type of capping ligands (associated with the outer layer). As is know from above art, inorganic capping agents can be discrete species, linear or branched chains, or two-dimensional sheets. Ionic inorganic capping agents are commonly referred to as salts, a pairing of a cation and an anion, and the portion of the salt specifically referred to as an inorganic capping agent is the ion that displaces the organic capping agent and caps the nanoparticle. Often an inorganic ion is paired with an ion that has organic functionality; the paired ion that does not displace organic capping agents is referred to herein as a counter ion. The counter ion can affect the solubility and reactivity of the inorganic capping agent as well as the inorganic capped nanomaterial but the great variability of counter ions allows for their facile replacement and a balance of desired properties. Instead of the term "ligand" also the terms "capping agent" or "capping ligand" or "coordinating ligand" are applied herein. As indicated above, the organic capping agent may be applied to stabilize the QD in an organic solvent. The inorganic capping ligands herein may also be defined as "coordinating ion" or "graft" or "grafting ligand".

The siloxane capping ligands may be provided to the nanoparticles in an exchange process, such as e.g. described in WO2014/064555 and WO 2014/064620, which are herein incorporated by reference. In such exchange process, the organic ligands on the nanoparticles, which are commercially available, are replaced by the siloxane ligands. Hence, in yet a further aspect the invention also provides a method for the production of a luminescent material as defined herein, the method comprising:
(i) providing siloxane polymer capping ligands comprising siloxane polymers which comprise at least one capping group comprising a terminal carboxylic acid group, wherein the capping group comprises in total at least six carbon atoms;
(ii) providing wavelength converter nanoparticles with organic capping ligands associated to the wavelength converter nanoparticles;
(iii) exchanging in an exchange process the organic capping ligands for the siloxane polymer capping ligands to provide said luminescent material.

The siloxane capping ligands especially have their capping or grafting functionality due to the capping group. This capping group includes an acid group or carboxylate group. As part of the total numbers of the carboxylate groups (on the respective ligands) may be negatively charged, due to the removal of the proton, especially in aqueous media, part of the carboxylate groups may coordinate to the nanoparticles, especially cations of the nanoparticles at the surface of such nanoparticles. Hence, the capping ligands are associated with the nanoparticle.

Especially, the siloxane polymers are linear polymers. Also the capping group is especially a linear group. The capping group may include one or more hetero atoms, such as N. The capping group especially comprises a terminal carboxylate group but may optionally further include also other non-hydrogen groups, such as one or more of O, N, F, Br, I, etc. As indicated above, the capping group at least comprises six carbon atoms, i.e.

especially six carbon atoms in a single linear chain, optionally interrupted with one or more heteroatoms. It appears that with a length of at least two carbon atoms, such as three or four carbon atoms, especially at least 6 carbon atoms in the capping group, especially in the linear chain, the embedding of such (ligand capped) particles in a siloxane polymer matrix is highly facilitated, and substantially more than with capping agents based on siloxane polymers with e.g. —$NH_2$ functional groups. It further also appears that when the number of carbons is less than 6, a good distribution of the nanoparticles in the silicone matrix is less easy. Further, especially no more than 12 carbon atoms are available (in the linear chain of the capping group).

Good results, especially in the sense that colloidal stable dispersion in silicones, i.e. miscible with silicones without aggregation, are obtained when an amine functional group (on a siloxane) is extended by reaction with a 2,5-dioxopyrrolidin-1-yl functionalized group, such as a carboxylic acid. The amine functional group will in general be configured not directly at the siloxane chain, at a Si atom, but more remote, with e.g. one or more carbon atoms in a chain, and optionally further heteroatoms. Especially, the amine group comprises —$(CH_2)_a$—NH, with a≥0, such as in the range of 1-5, like 1-3. In a specific embodiment, the capping group comprises —$(CH_2)_a$—NH—CO—$(CH_2)_x$—COOH, wherein a≥1 (especially at least two, such as at least 3), x≥0, especially at least 2, and a+x≥4. Especially, x≥2, like, 2, 3, 4, 5, or 6, etc., even more especially x≥4, such as 4, 5 or 6. Further, as indicated above, the capping group is especially a capping side group. Hence, especially the amine functional group is also a side group, and is not located on a terminal Si. Note that more than one of such amine group may be available, though especially only a few, especially only one (see also above). Further, as also indicated above, the wavelength converter nanoparticles may especially comprise quantum dots. Combinations of different capping ligands, or substantially the same capping ligands but different capping groups, may also be applied. The length of the first spacer, defined by a, and the length of the second spacer, defined by x, may be chosen independently of each other. The value for a is especially at least 2, such as 3 or more. The value for x is especially at least 2, even more especially at least three. However, optionally, carboxylic acids without a hetero atom may also be applied. The number of ($CH_2$) groups between Si and the carboxylic group (C(O)OH) may especially be at least 1, even more especially at least 2, such as at least 3, like 4 or more. The capping group, including the carboxylic acid, may coordinate to the nanoparticle. In general, the carboxylic acid will then be in the deprotonated state, by which the $C(O)O^-$ group can e.g. bind to one or more cations at the nanoparticle surface.

In yet a further specific embodiment, with which good results, also in terms of stability (degradation rate) were obtained, the capping group comprises —$(CH_2)_3$—NH—CO—$(CH_2)_x$—COOH, wherein x≥1, even more especially the capping group comprises —$(CH_2)_3$—NH—CO—$(CH_2)_x$—COOH, wherein 4≤x≤6. With these systems, even better results were obtained, in terms of stability and dispersability, than with x<4. Further, best results were obtained when the siloxane polymers (i.e. the ligand siloxane polymers) have a Mw of at least 10 kg/mole, even more especial 15 kg/mole, yet even more especially 22 kg/mole.

In yet a further aspect, the invention also provides a method for the production of a siloxane polymer capping ligand as defined herein, comprising reacting a siloxane polymer having the formula:

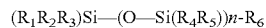

wherein:
$R_1,R_2,R_3,R_6$ are independently selected from the group consisting of H, OH, methyl, phenyl and $R_7$,
$R_4,R_5$ are independently selected from the group consisting of methyl, phenyl and $R_7$, with n≥1,
$R_7$ comprises —$(CH_2)_a$—$NH_2$, wherein especially a≥1 (such as especially at least 2, even more especially at least 3);
with the total number of groups $R_7$ in the siloxane polymer especially selected from the range of ≥1 and ≤2n, and no more than in total 10 amine groups per siloxane polymer;
with a molecule 6b-d, having the formula:

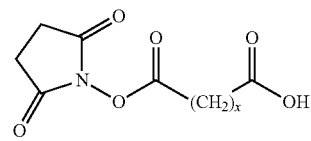

wherein x≥1.
Such method may provide the siloxane polymer capping ligand per se, which is also part of the invention. Hence, the invention also provides such capping ligand, obtainable with the above defined method. The invention also provides in a further aspect a siloxane polymer capping ligand comprising at least one capping group R8 comprising a terminal carboxylic acid group, wherein the capping group comprises in total at least six carbon atoms, the siloxane polymer capping ligand having the formula:

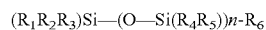

wherein:
$R_1,R_2,R_3,R_6$ are independently selected from the group consisting of H, OH, methyl, phenyl and $R_8$,
$R_4,R_5$ are independently selected from the group consisting of methyl, phenyl and $R_8$, with n≥1, $R_8$ comprises —$(CH_2)_a$—NH—CO—$(CH_2)_x$—COOH, wherein a≥1, x≥0, and a+x≥4, and with the total number of capping groups Rg in the siloxane polymer capping ligand selected from the range of ≥1 and ≤2n, and no more than in total 10 capping groups per siloxane polymer capping ligand.

Especially, $R_1$, $R_2$, $R_3$, are independently selected from the group consisting of H, OH, methyl, and phenyl. When $R_6$=$R_8$, then the ligand comprises a terminal capping group. The groups $R_4$, $R_5$ are independently selected from the group consisting of methyl, phenyl and $R_8$. Note that when the Si atom closest to $R_6$ comprises a $R_4$ and/or $R_5$ being $R_8$, and $R_6$ being e.g. H, or OH or methyl or phenyl, etc., then also in such embodiment the capping ligand comprises a terminal capping group. As indicated above, non-terminal capping groups surprisingly seem to provide better results in terms of dispersability and prevention of agglomeration.

Hence, especially the capping group herein is a side group to the siloxane chain, i.e. chemically bound to a non-terminal Si atom. Hence, the capping group may in embodiments also be indicated as capping side group (to the siloxane polymer. Hence, especially the siloxane polymer with the capping group provides the capping ligand (functionality).

In general, n will be (substantially) larger than 1, such as at least 20, like at least 60, like in the range of 60-600, as—as indicated above—especially the siloxane polymer of the ligand has a Mw of at least 22 kg/mole. In such embodiment there are n $R_4$ and n $R_5$ groups. Especially, only a limited number thereof, such as 1-4 will comprise $R_8$. Substantially all (other) $R_4$ and $R_5$ groups will independently be selected from methyl and phenyl. For the sake of understanding, the following example is given, wherein by way of example n=3:

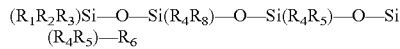

$(R_1R_2R_3)Si$—O—$Si(R_4R_8)$—O—$Si(R_4R_5)$—O—Si$(R_4R_5)$—$R_6$

In such molecule, all $R_4$ and $R_5$ may independently be selected from methyl and phenyl, the only $R_6$ may be selected from H, OH, methyl and phenyl, and only one Si backbone atom (i.e. non-terminal Si atom) includes the $R_8$ group with the terminal carboxylate (i.e. one of all $R_4$ and $R_4$ is chosen to be $R_8$).

Hence, each $R_1$ may be chosen independently of the other $R_2$,$R_3$, $R_4$, $R_5$ and $R_6$; likewise, each $R_2$ may be chosen independently of the other $R_1$,$R_3$, $R_4$, $R_5$ and $R_6$, etc. Further, each $R_4$ and $R_5$ may independently chosen for each of the n Si backbone atoms. In general most of $R_4$ and $R_4$ are independently chosen for each of the n Si backbone elements out of methyl and phenyl, with only a few, especially only one of the Si backbone elements carrying $R_8$. When however there are more than one $R_8$ groups, each of the $R_8$ groups may be independently selected from the herein indicated embodiments of $R_8$.

The $R_7$ groups can be converted into the $R_8$ group. Hence, the herein indicated embodiments with respect to number and position of $R_8$ groups in the siloxane ligand may also relate to the number and position of the $R_7$ groups, respectively, and also vice versa.

The nano particles are wavelength converter nano particles, which may especially be configured to provide, upon excitation by UV and/or blue light, luminescence in at least part of the visible part of the spectrum. Hence, these particles are herein also indicated as wavelength converter nano particles, of which QDs (quantum dots) are a specific embodiment. Such wavelength converter nano particles may show luminescence (when e.g. embedded in the matrix of cured siloxane polymers) with a high quantum yield and stability. Further, the wavelength converter may be relatively temperature and/or photo chemically stable and/or transparent. Further, with this process, nano particles may be dispersed in the polymer in a relative even way, without the substantial disadvantage of agglomeration.

Hence, the wavelength converter nanoparticles may e.g. be used to include in a body, such as a siloxane polymer comprising body. Hence, in a further aspect the invention provides a wavelength converter comprising a siloxane polymer matrix with wavelength converter nano particles embedded therein with siloxane polymer capping ligands associated to the wavelength converter nanoparticles, wherein the siloxane polymer capping ligands comprise siloxane polymers which comprise at least one capping group comprising a terminal carboxylic acid group, wherein the capping group comprises in total at least six carbon atoms, and wherein the siloxane polymer matrix comprises matrix siloxane polymers, with cross-links between one or more of (i) matrix siloxane polymers and (ii) matrix siloxane polymers and capping ligand siloxane polymers.

Though the luminescent material may especially be embedded in a silicone matrix, the invention is not limited to such wavelength converters.

The same embodiments as described above with respect to the luminescent material also apply to the embedded QDs. Hence, in an embodiment the capping groups comprise —$(CH_2)_3$—NH—CO—$(CH_2)_x$—COOH, wherein 4≤x≤6, wherein the capping group is a capping side group, and wherein the siloxane polymers have a Mw of at least 22 kg/mole.

There is a number of ways to implement the nanoparticles with capping ligands in a matrix, especially a silicone matrix.

In a first embodiment, the invention also provides a process for the production of a light converter comprising a siloxane polymer matrix with light converter nano particles (herein also indicated as "nano particles") embedded therein, the process comprising:

(a) mixing (i) light converter nano particles having an outer surface grafted with grafting ligands and (ii) curable siloxane polymers, and (b) curing the curable siloxane polymers, thereby producing the light converter;

wherein the grafting ligands comprise siloxane having x1 Si backbone elements, wherein at least one Si backbone element of each siloxane grafting ligand comprises a side group having a grafting functionality, as defined herein;

wherein the curable siloxane polymers have y1 Si backbone elements;

wherein x1 is especially at least 20, such as especially at least 40, even more especially at least 50, wherein y1 is especially at least 2, such as at least 7, like at least 10, and wherein especially x1/y1≥0.8, such as x1/y1≥0.95, such as >1, like at least ≥1.2.

Such process is described in WO2014/064620 which is incorporated herein by reference. Hence, in an embodiment of the wavelength converter the capping ligands comprise siloxane capping ligands having x1 Si backbone elements, wherein the matrix siloxane polymers have y1 Si backbone elements, and wherein x1 is at least 20, wherein y1 is at least 2, and wherein x1/y1≥0.8 (see also above and/or WO2014/064620 for further specific embodiments).

It appears that first dispersing the grafted nano particles in short chain (curable) siloxane polymers and then combining with long change curable siloxane polymers, wavelength converters may be obtained with good lighting properties and a good distribution of the nano particles. Hence, in a second embodiment, the invention provides a process for the production of a wavelength converter comprising a siloxane polymer matrix with wavelength converter nano particles (herein also indicated as "nano particles") embedded therein, the process comprising: (a) mixing (i) a first liquid comprising (i1) short chain siloxane polymers ("S polymers") and (i2) wavelength converter nano particles having an outer surface grafted with siloxane grafting ligands ("X polymers") and (ii) curable siloxane polymers ("Y polymers"), and (b) curing the curable siloxane polymers, thereby producing the wavelength converter; wherein the short chain siloxane polymers have s1 Si backbone elements, wherein the siloxane grafting ligands comprise siloxane grafting ligands having x1 Si backbone elements, wherein at least one Si backbone element of each siloxane grafting ligand comprises a group having a grafting functionality; and wherein the curable siloxane polymers have y1 Si backbone elements; wherein $x1/s1 \geq 0.8$, such as $x1/s1 \geq 0.95$, such as $>1$, like at least $\geq 1.2$, such as at least $>2$, wherein $s1 < y1$, such as $s1/y1 < 0.25$, and wherein in a specific embodiment $x1 < y1$.

Such process is described in WO2014/064555 which is incorporated herein by reference. Hence, the invention also provides an embodiment of the wavelength converter as defined herein, wherein the capping ligands comprise siloxane capping ligands having x1 Si backbone elements, wherein the siloxane polymer matrix comprises siloxane polymers of a first type and siloxane polymers of a second type, wherein at least part of the second type of siloxane polymers are cross-linked, wherein the siloxane polymers of the first type comprise short chain siloxane polymers having s1 Si backbone elements, wherein the siloxane polymers of the second type comprise siloxane polymers having y1 Si backbone elements, wherein $x1/s1 \geq 0.8$, $s1 < y1$ and wherein $x1 < y1$ (see also above and/or WO2014/064555 for further specific embodiments).

Such wavelength converter, obtainable by the herein described process(es), may show luminescence (when embedded in the matrix of cured siloxane polymers) with a high quantum yield and stability. Further, the wavelength converter may be relatively temperature and/or photo chemically stable and/or transparent. Further, with this process, nano particles may be dispersed in the polymer in a relative even way, without the substantial disadvantage of agglomeration. As indicated above, especially the wavelength converter nanoparticles comprise quantum dots.

Especially, the matrix of the cured (curable) siloxane polymers is transmissive for light having a wavelength selected from the range of 380-750 nm. For instance, the matrix of the cured (curable) siloxane polymers may be transmissive for blue, and/or green, and/or red light. Especially, the matrix of the cured (curable) siloxane polymers is transmissive for at least the entire range of 420-680 nm. Especially, the matrix of the cured (curable) siloxane polymers has a light transmission in the range of 50-100%, especially in the range of 70-100%, for light generated by the light source of the lighting unit (see also below) and having a wavelength selected from the visible wavelength range. In this way, the matrix of the cured (curable) siloxane polymers is transmissive for visible light from the lighting unit. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). The light converter may be transparent or translucent, but may especially be transparent. Especially, the light converter is substantially transparent and/or does not substantially scatter light. When the light converter is transparent, light of the light source may not entirely be absorbed by the light converter. Especially when using blue light, this may be of interest, as the blue light may be used to excite the light converter nano particles and may be used to provide a blue component (in white light). Hence, especially curable siloxane polymers are applied that provide a substantially transmissive matrix (or host) for the light converter nano particles.

As these wavelength converters may well be applied in lighting devices, the invention provides in yet a further aspect a lighting device comprising a light source configured to generate light source light (i.e. light from the light source), one or more of (i) the luminescent material as defined herein, (ii) the luminescent material obtainable with the method as defined herein, and (iii) the wavelength converter as defined herein, configured to convert at least part of the light source light into visible converter light. In yet a further aspect, the invention also provides a liquid crystal display device comprising one or more backlighting units, wherein the one or more backlighting units comprise one or more lighting devices as defined herein.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The term "substantially" herein, such as in "substantially all light" or in "substantially consists", will be understood by the person skilled in the art. The term "substantially" may also include embodiments with "entirely", "completely", "all", etc.

Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale.

FIGS. 3a-3d schematically depict some reaction schemes and molecules; and

Figure 4:
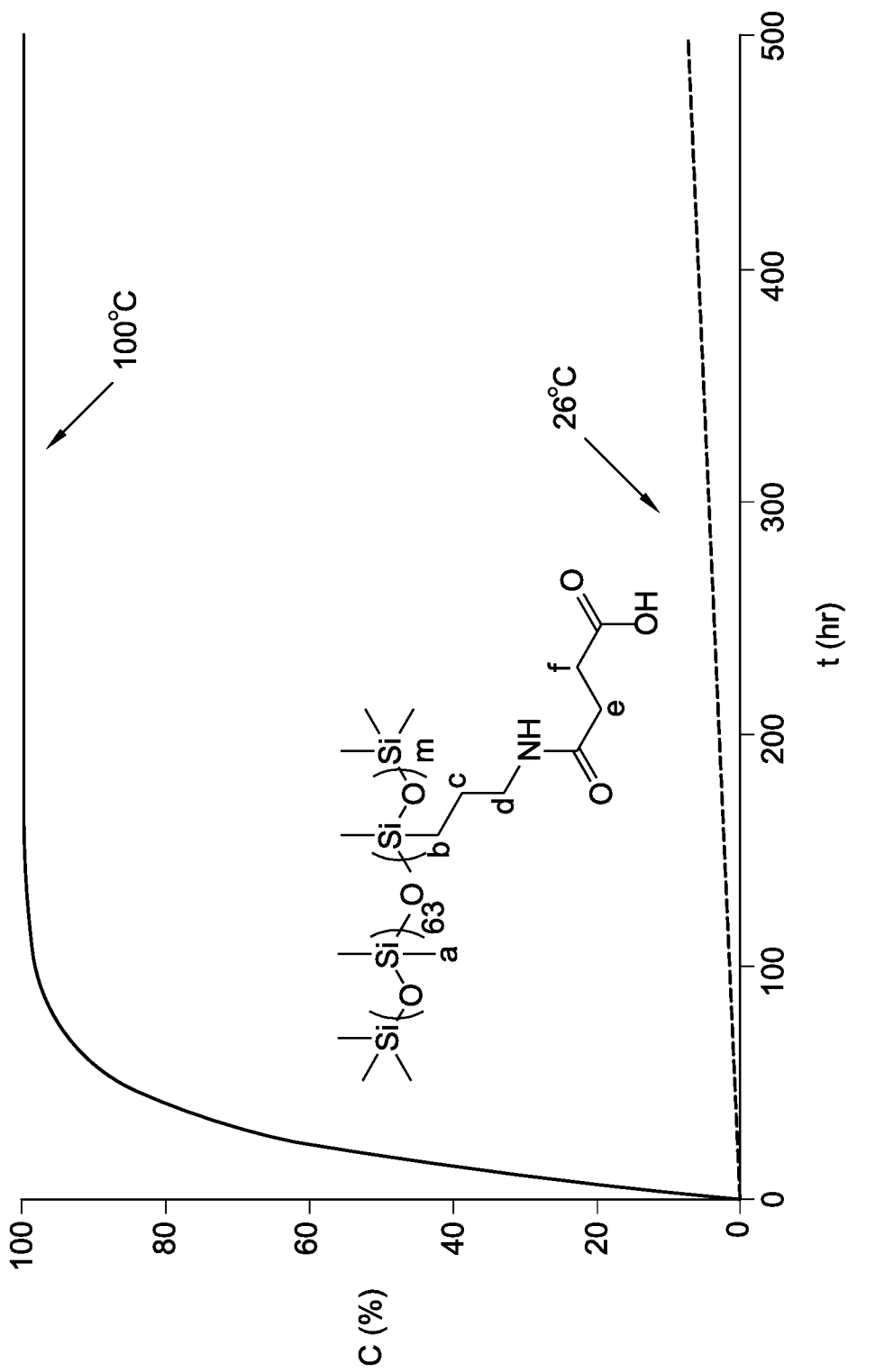

FIG. 4 shows the conversion efficiency (C)(in %) of the conversion of compound 2a to compound 3 as function of the time (hours) at two temperatures.

DETAILED DESCRIPTION OF THE EMBODIMENTS

Figure 1A:
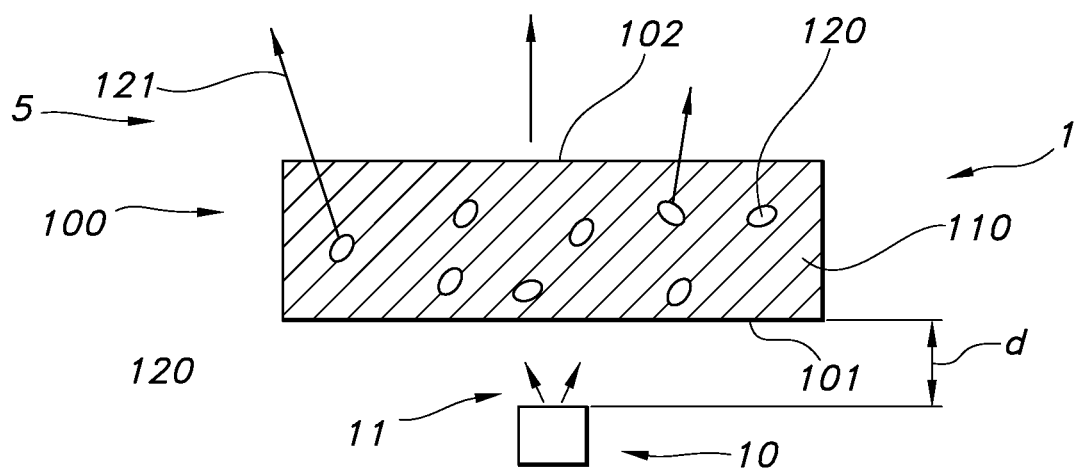
FIGS. 1a-1c schematically depict some aspects of the device(s) of the invention.

FIG. 1a schematically depicts a lighting device 1 comprising a light source 10 configured to generate light source light 11 and a wavelength converter 100 configured to convert at least part of the light source light 11 into visible converter light 121. Here schematically only one light source 10 is depicted. However, more than one light source 10 may be present. The wavelength converter has an upstream side 101 (part of an external surface of the wavelength converter), which is at least partly directed to the light source 10, and a downstream side 102 (part of an external surface of the wavelength converter), which faces away from the light source 10 (in this transmissive configuration).

The wavelength converter 100 comprises a polymeric host material 110 with wavelength converter nanoparticles 120 embedded in the polymeric host material 110. These can be dots, rods, a combination thereof, etc. (see also above). The wavelength converter nanoparticles 120 generate upon excitation by the light source light 11 visible converter light (and optionally also non-visible radiation, like IR radiation). At least part of the converter light 121 escapes from the downstream side 102 as lighting device light 5. This lighting device light 5, of which at least part is in the visible, at least contains part of the converter light 121, and may optionally also contain some remaining light source light 11. Especially, the light source light is blue light. The light converter nano particles or wavelength converter nanoparticles 120 may be chosen to provide white light upon conversion of the light of the light source. Alternatively or additionally, the wavelength converter nanoparticles 120 are chosen to provide light upon conversion of the light of the light source and this light together with the light of the light source provides white light. Alternatively or additionally, the light converter nano particles or wavelength converter nanoparticles 120 may be chosen to provide, together with another luminescent material, white light upon conversion of the light of the light source. Alternatively or additionally, the wavelength converter nanoparticles 120 are chosen to provide, together with another luminescent material, light upon conversion of the light of the light source and this light together with the light of the light source provides white light. The other luminescent material may also refer to a plurality of luminescent materials. Examples are mentioned above. FIG. 1a schematically depicts the lighting device in operation.

Figure 1B:
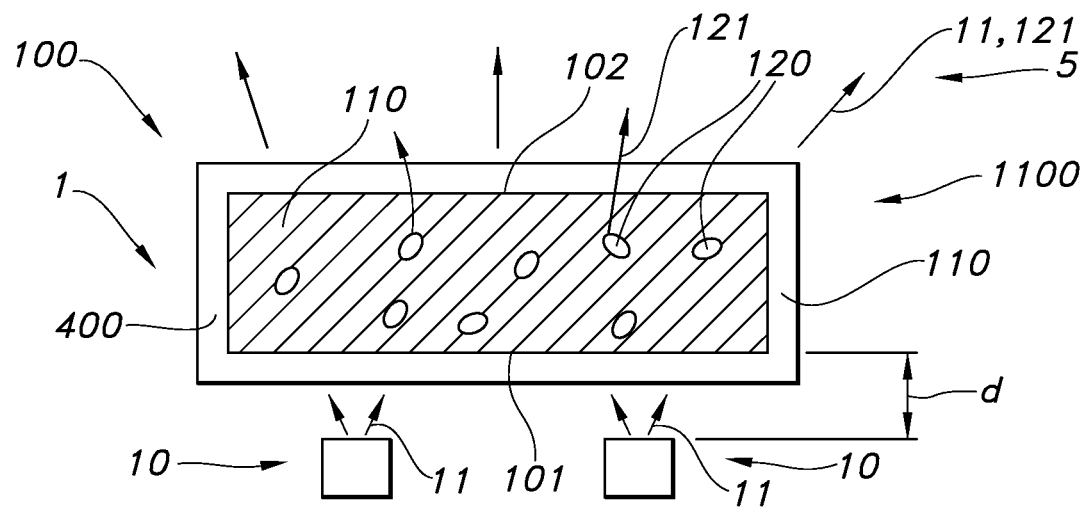
Figure 1C:
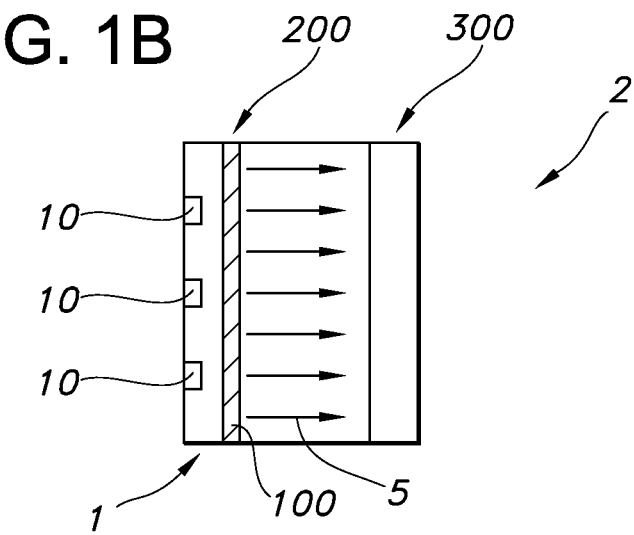

FIG. 1b schematically depicts another embodiment, wherein the wavelength converter 100 is encapsulated. An encapsulation 400 encloses the wavelength converter; this encapsulation may substantially block oxygen (and/or $H_2O$) transporter from the atmosphere to the wavelength converter. This may add to the stability of the wavelength converter nanoparticles 120 (and the polymeric host). The combination of wavelength converter 100 and encapsulation 400 is herein also indicated as wavelength converter unit 1100. FIG. 1c schematically depicts one of the applications of the lighting unit 1, here in a liquid crystal display device 2, which comprises a back lighting unit 200 which comprises one or more lighting units 1 (here, one lighting unit is schematically depicted), as well as a LCD panel 300, which can be backlighted with the lighting device light 5 of the lighting unit(s) 100 of the back lighting unit 200.

The converter 100 may especially be arranged at a non-zero distance d from the light source 10, which may for instance be a light emitting diode, although the distance d may also be zero, for instance when the luminescent material 30 is applied on a LED die or embedded in a (silicone) cone on the LED die. The converter may optionally allow at least part of the light source light 21 penetrate through the converter. In this way, downstream of the converter, a combination of converter light 121 and light source light 11 may be found. The light downstream of the wavelength converter is indicated a lighting device light 5. The distance d may especially be in the range of 0.1-100 mm, especially 0.5-100 mm, such as 1-20 mm, like especially 1-50 mm, like about 1-3 for applications close by the light source and 5-50 mm for more remote applications. Note however that the invention is not limited to applications wherein d>0. The invention, and the herein described specific embodiments, may be also applied in other embodiments with d=0. In such instances, the wavelength converter may especially be configured in physical contact with the LED die.

In addition to the ligand grafted semiconductor based wavelength converter nano particles 120, the wavelength converter 100 may optionally comprise also other types of luminescent materials, for instance to tune the color of the lighting unit light 5, to increase the color rendering, to tune the color temperature, etc.

Figure 2A:
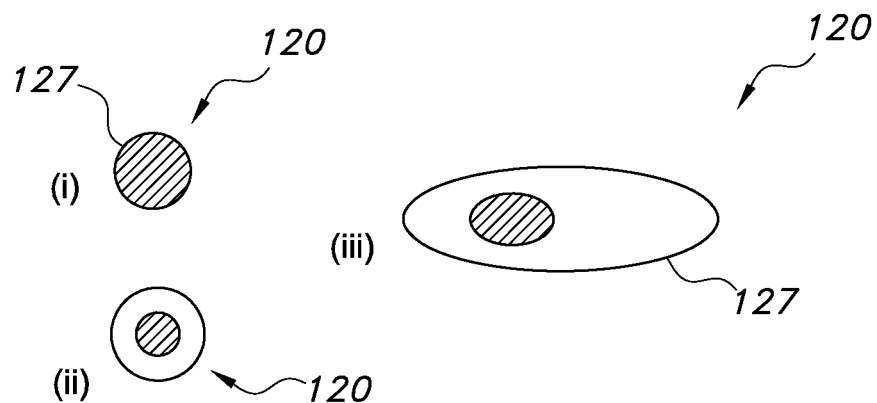
FIGS. 2a-2d schematically depict some further aspects of the invention.

FIG. 2a schematically depict a non-limiting number of examples of wavelength converter nano particles 120, here quantum dots (QDs). By way of example, (i) indicates a QD particle, having the shape of a dot, without further layers. For instance, this may be e.g. CdSe. Siloxane grafting ligands are not shown for the sake of clarity (see below). The QD example (ii) schematically depicts a core shell system, by way of example (CdSe)ZnS (core)shell. The QD example (iii) schematically depicts a dot in rod QD system, e.g. (CdS)ZnS dot in rod (which is also a type of core-shell QD). The wavelength converter nano particles have an outer surface indicated with reference 127.

Figure 2B:
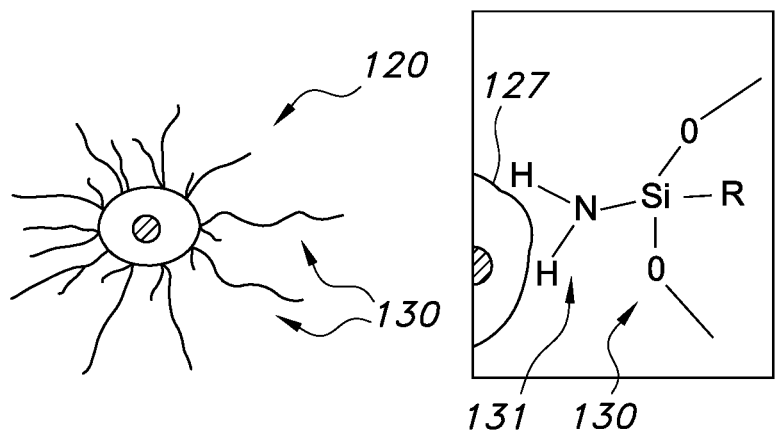

FIG. 2b schematically depicts a QD with grafting ligand. As can be seen, in this example the side groups having a grafting functionality (the group is indicated with reference 131) are not end groups; the grafting ligands attach to the outer surface 127 of the wavelength converter nano particles. Hence, the siloxane grafting ligands may have (at least) two tails. Would the siloxane grafting ligands have more than one side group having a grafting functionality, other (more complex) structures may be found. In the insert, an enlargement is shown, with two tails at both sides of the silicone backbone element that bears the side group having a grafting functionality that binds to the outer surface 127 of the wavelength converter nano particle. The grafting ligands are indicated with reference 130. In FIG. 2b by way of example an amine group as coordinating or binding group is depicted. In the present invention, however, the binding group is the carboxylate group (or the deprotonated carboxylate group). One or more atoms thereof may coordinate with the surface of the particle. The deprotonated carboxylic acid is a negatively charged system (delocalized electron), which may coordinate to cations at the surface of the particle. FIG. 2b is especially used to show that a single ligand with a non-terminal grafting group may have two "tails".

Figure 2C:
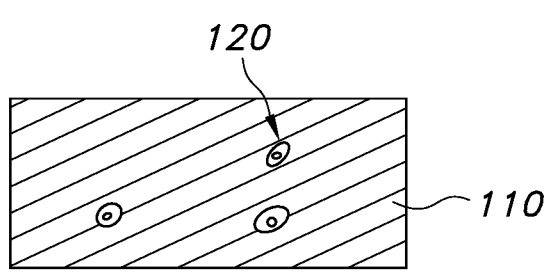
Figure 2D:
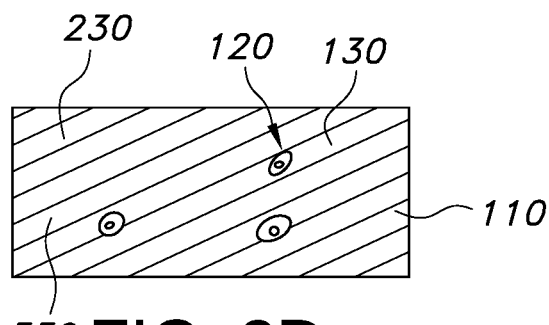

After curing, such as by heating and in the presence of a catalyst in the mixture in a vessel, the cured system is obtained, i.e. the light converter, as schematically depicted in FIG. 2c. The cured siloxane polymers, now forming a silicone, are considered the polymeric host material 110 for the light converter nano particles 120, such as QDs (see also above). Alternatively, after curing, such as by heating and in the presence of a catalyst in a mixture in a vessel, the cured system is obtained, i.e. the wavelength converter, as schematically depicted in FIG. 2d. The cured siloxane polymers, now forming a silicone, are considered the polymeric host material 110 for the wavelength converter nano particles 120, such as QDs (see also above). Siloxane polymers of the matrix are indicated with reference 330, and short chain siloxane polymers are indicated with reference 230.

As indicated above, by exchanging these native ligands by ligands that are compatible with silicones, the quantum dots can be homogeneously dispersed in the silicone material. In an example, a silicone derived ligand (structure 2a, FIG. 3a) was introduced that indeed was capable to disperse the quantum dots in a commercial silicone mixture.

Because silicones containing small amounts of acid side-groups are not available commercially and are very difficult to prepare, the commercially available compound 1 (ABCR, AB109373) was used to be converted with succinic anhydride to compound 2a. Compound 2a showed to be a ligand that is capable of dispersing the quantum dots in croslinkable silicones that form a solid polymer after curing. Unfortunately, compound 2a turned out to be relatively unstable. Upon storage at room temperature, it was converted slowly in compound 3 with the formation of water. If compound 2a was used at 100° C. for ligand exchange on the quantum dots it is converted fast into compound 3. Compound 3 didn't have the stabilizing properties for dispersing the quantum dots. This means that even after formation of the polymeric layer, the quantum dots are in a potentially unstable environment affecting the lifetime of the color converting layer. Furthermore, the mix of silicone prepolymer and quantum dots stabilized by compound 2a turned out to be relatively unstable in the sense that the quantum dots still separated after a while (this is called flocculation). This flocculation process especially occurred with relatively high viscous and thus high molecular weight silicone materials (due to depletion effects).

Figure 3A:
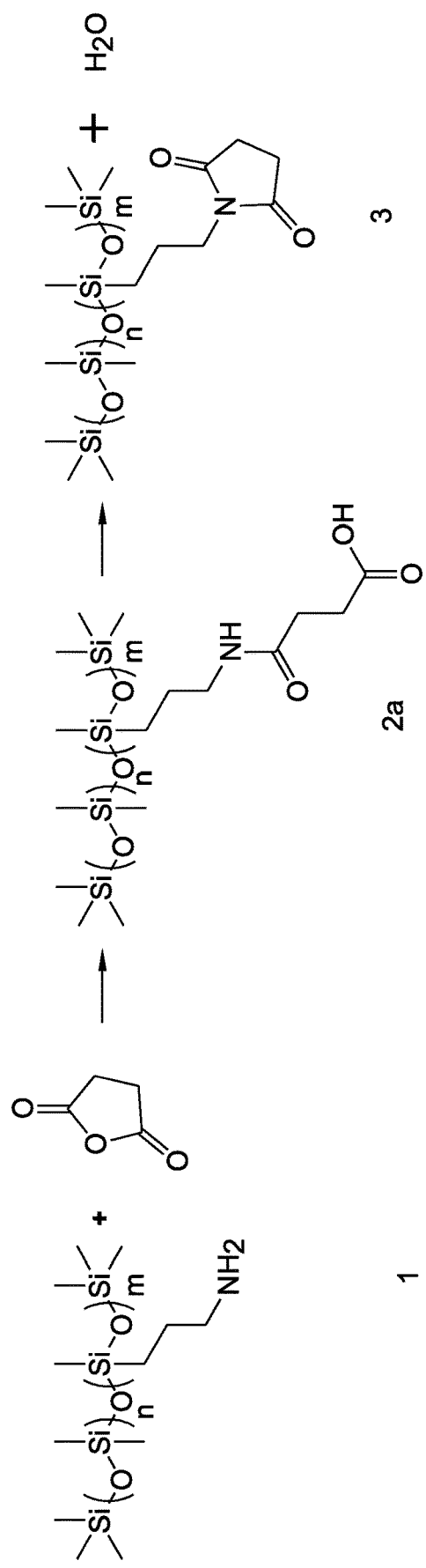
Figure 3B:
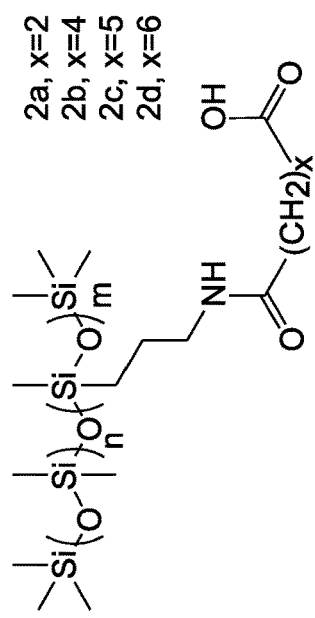
Figure 3C:
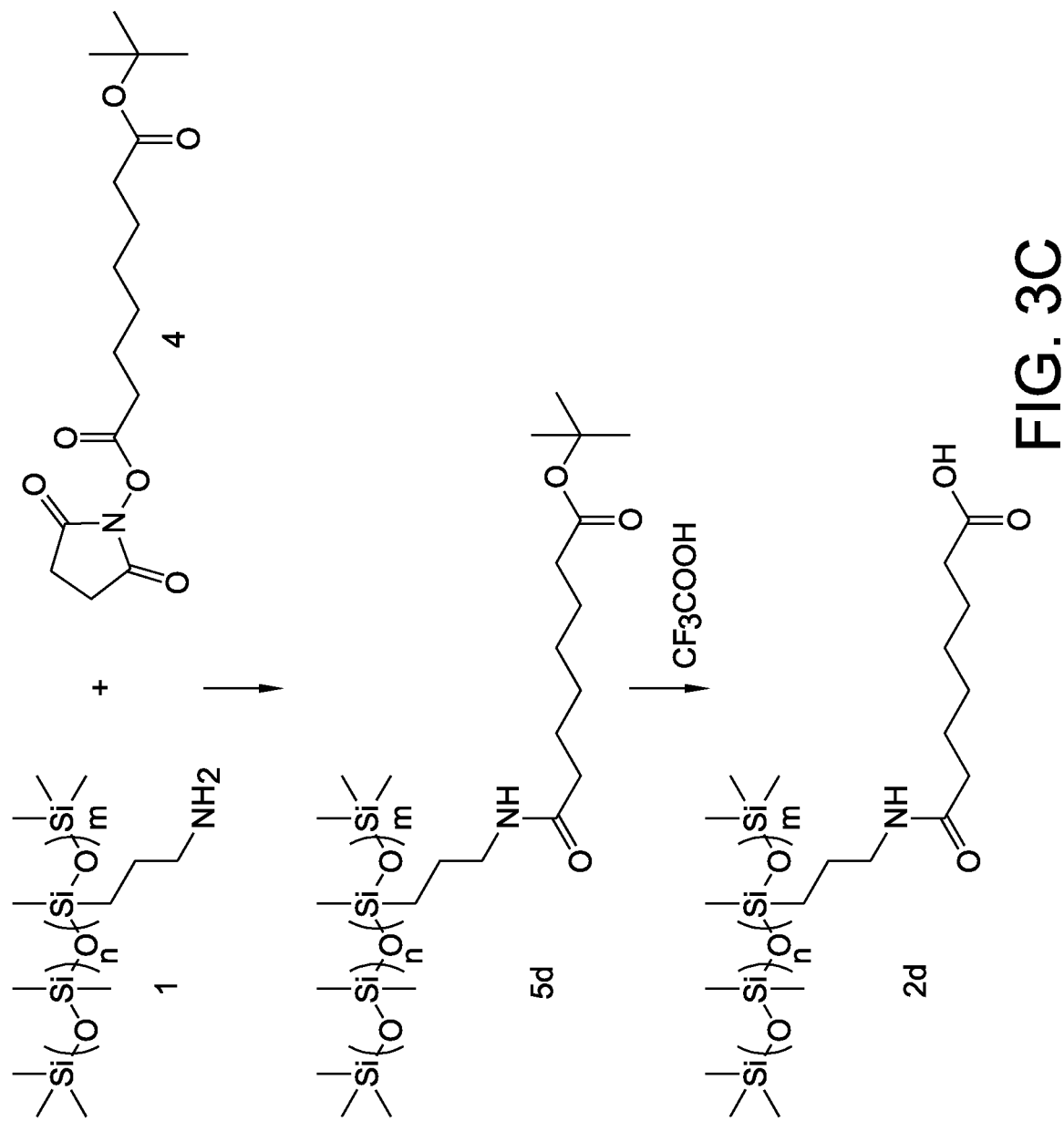

It was found that if compound 2a was replaced by compounds 2b-2d (see FIG. 3b), stable materials were obtained that do not show the decomposition as observed for compound 2a in FIG. 3a. The side chain on the siloxane polymer is herein indicated as capping group. Due the presence of this group, especially its carboxylate terminal group, the capping ligand may coordinate (associate) with the nano particles or quantum dots. FIG. 3c shows how a person skilled in the art would make for example compound 2d. Unfortunately, the formation of the free acid 2d from 5d suffers from decomposition of the siloxane chain during the reaction with trifluoroacetic acid, resulting in material with relatively low molecular weight (decrease in the value of n). The material obtained in this way is very well capable of dispersing quantum dots in solvents, however, in the high molecular weight (~50 kg/mol) silicone based prepolymer that is used to make the solid matrix flocculation occurs rapidly.

In FIG. 3c, the compound 2d has the capping group at a non-terminal Si atom. Further, the capping group comprises three carbon atoms between Si and the hetero atom N, and comprises eight further carbon atoms between the hetero atom and the —OH group of the carboxylic acid, i.e. in total 11 carbon atoms. In terms of the formula for the siloxane:

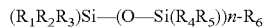

here a single $R_4$ or $R_5$ includes the capping ligand $R_8$. In terms of the formula $R_8$ for the capping ligand:

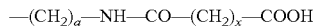

the value for a is for the 2d capping group 3 and the value for x is 6. For system 2a (see FIG. 3A), these values are a=3 and x=2, respectively (i.e. in total 7 carbon atoms). Especially, a is at least 3, and x is at least 4, making at total number of carbon atoms in the capping group of at least 9.

Figure 3D:
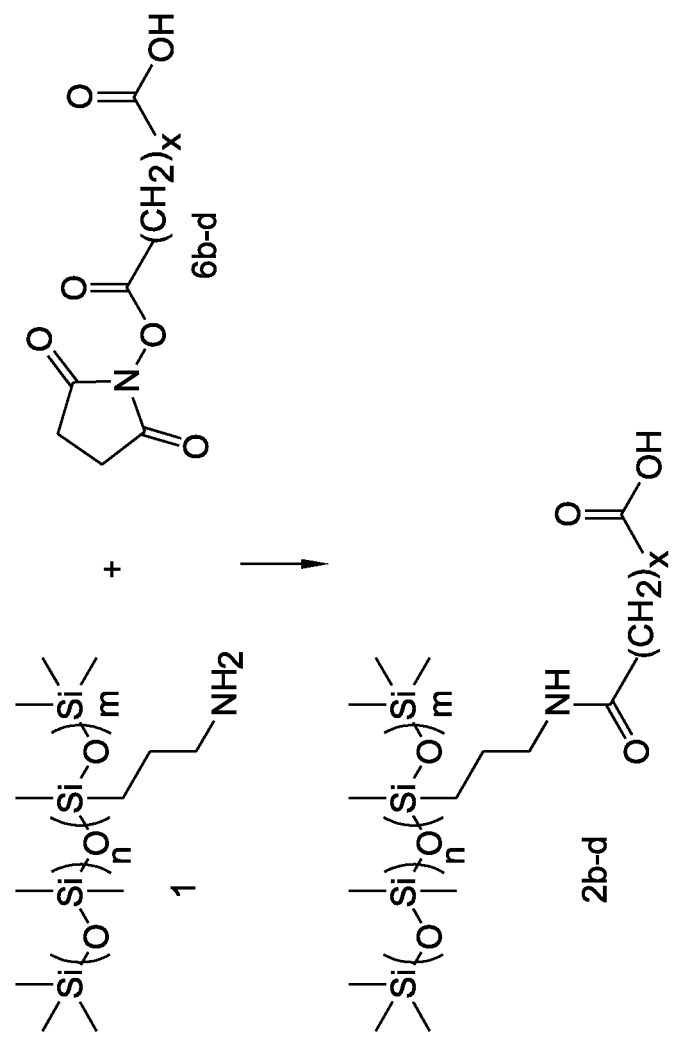

Surprisingly, we could make compound 2d (and also compounds 2b and 2c) by simply using unprotected acid 6d (or 6b and 6c) as outlined in FIG. 3d. In this case the siloxane bond remained unattacked during the chemical reactions. If the starting amine derived silicone 1 in the reaction shown in FIG. 3d was replaced by a similar polymer but with higher viscosity and thus higher molecular weight (ca. 28000 vs. ca. 5000 g/mole), ligands were obtained that function as good as made from the original amine. However, depending on the molecular weight of the prepolymers that form the matrix, using the longer ligands results in a delay or absence of flocculation compared to the shorter ones. This is an advantage in the processing of the materials.

FIGS. 3a-3d schematically depict siloxane capping ligands with the capping group as side group (not as terminal group), which appears to provide best results.

EXAMPLES

Synthesis.

As an example, the synthesis of compound 2b starting with amine ABCR AB109373 (short chain) is provided.

A: 6-((2,5-dioxopyrrolidin-1-yl)oxy)-6-oxohexanoic acid (6b) was made from adipic acid according to: A. H. F. Lee et al., Tetrahedron 59 (2003) 833-839.

B: copoly(dimethylsilanone-6-((3-(methyl(oxo)silyl)propyl)amino)-6-oxohexanoic acid) (2b).

A solution of 450 mg of 6-((2,5-dioxopyrrolidin-1-yl)oxy)-6-oxohexanoic acid (6b; 1,85 mmol) in 20 ml of ethyl acetate was added dropwise to a solution of 9.25 g copoly (dimethylsilanone-4-(3-(methyl(oxo)silyl)propyl)amine) (1, contains 1.85 mmol of amino groups) and 0.84 g of diisopropylethylamine (6.48 mmole) in 60 ml of ethyl aceatate. After stirring for 72 hours, the solution was washed 5 times with 30 ml of a 2N hydrochloric acid solution, 3 times with 30 ml of brine and dried over magnesium sulphate. After dissolution in 15 ml of n-heptane, filtration over a filter paper was performed. 6,6 g (70%) of copoly(dimethylsilanone-6-((3-(methyl(oxo)silyl)propyl)amino)-6-oxohexanoic acid) (2b) was obtained as a clear oil.

The ligand made from the high molecular weight material 1 was made in a similar manner and obtained as a very viscous gel.

The compounds 2c and 2d with low molecular weight and with high molecular weight were made similar to that described above for 2b. Compounds 6c and 6d were prepared in the same way as described for compound 6b, starting with pimelic acid and suberic acid, respectively.

Thermal Stability

As discussed before (see FIG. 3a), a neat sample of 2a showed conversion to compound 3 upon heating. FIG. 4 shows the conversion as a function of time at 100° C. and 26° C.

The conversion was measured with the aid of the NMR. The half-life measured at 100° C. is about 24 Hrs. Even at room temperature (26° C.) conversion to 3 was observed. Neat samples of compounds 2b, 2c and 2d were heated at 100° C. for 72 hours. NMR measurements showed no spectral changes that point to degradation after this treatment.

This clearly shows the strong increase in stability of compounds 2b-2d compared to 2a.

Stability of Quantum Dots Mixtures.

A small amount of commercially available QDs in heptane was added to 1 ml of the pure ligand 2b, 2c and 2d made from the low molecular amino functionalized siloxane or from the high molecular weight siloxane. Turbid mixtures, were obtained in nearly all cases. The mixtures were stirred for about 16 hours at 100° C. The resulting ligand-QD mixtures were transparent, which provides evidence for ligand exchange. After cooling, the mixture was directly added to the silicones with various viscosity and thus molecular weight. The degree of mixing was determined by visual inspection of the obtained mixture. The results are shown in table 1. It shows that at least up to mixing with silicones of Viscosity 100 cSt good dispersion is obtained. This is impossible if the native ligands of the quantum dots are used.

TABLE 1

| ligand | Molecular weight | Viscosity 50 cSt | Viscosity 100 cSt | Viscosity 500 cSt | Viscosity 1000 cSt |
|---|---|---|---|---|---|
| 2a | Low* | clear | hazy | Not tested | Not tested |
| 2a | High# | clear | clear | clear | hazy |
| 2b | low | clear | hazy | Not tested | hazy |
| 2b | high | clear | clear | hazy | hazy |
| 2c | low | clear | hazy | hazy | Not tested |
| 2c | high | Not tested | clear | hazy | hazy |
| 2d | low | clear | clear | Not tested | Not tested |
| 2d | high | clear | clear | hazy | hazy |

*Mn about 7000.
Mn about 20000.

Color Converting Layers.

To prepare layers with quantum dots that act as color converters, the dots with various ligands dissolved in toluene where mixed with a reactive mixture of silicones namely: 0.2 ml of hydroxysiloxane containing AB109389 (Mw 2000-3000), 0.8 ml of vinyl group containing AB109356 (Mw about 5000) and a small amount of platinum catalyst for curing namely: AB146697. The layers were cured at 150° C. for one hour, resulting in non-scattering films of silicone rubbers.

Qdots coated with the high Mw version of the ligand 2b were mixed with a commercial silicone precursor material (KJR9226). In this material, qdots coated with the short version of the ligand give an opaque mixture indicative of (depletion) flocculation of the qdots. The higher Mw ligand version remained transparent, and afforded clear films after curing for 2 hours at 150° C.

The invention claimed is:

1. A luminescent material comprising wavelength converter nanoparticles with siloxane polymer capping ligands associated to the wavelength converter nanoparticles, wherein the siloxane polymer capping ligands comprise siloxane polymers which comprise at least one capping group comprising a terminal carboxylic acid group, wherein the capping group comprises in total at least six carbon atoms, wherein the total number of carbon atoms in the capping group is equal to or less than 20 carbon atoms, wherein the capping group comprises —($CH_2$)$_3$—NH—CO—($CH_2$)$_x$—COOH, and wherein 4≤x≤6.

2. The luminescent material according to claim 1, wherein the capping group is a capping side group, and wherein the wavelength converter nanoparticles comprise quantum dots.

3. The luminescent material according to claim 1, wherein x=6.

4. The luminescent material according to claim 1, wherein the siloxane polymers have a Mw of at least 22 kg/mole.

5. A wavelength converter comprising a siloxane polymer matrix with wavelength converter nanoparticles embedded therein with siloxane polymer capping ligands associated to the wavelength converter nanoparticles, wherein the siloxane polymer capping ligands comprise siloxane polymers which comprise at least one capping group comprising a terminal carboxylic acid group, wherein the capping group comprises in total at least six carbon atoms and wherein the total number of carbon atoms in the capping group is equal to or less than 20 carbon atoms, wherein the capping group comprises —($CH_2$)$_3$—NH—CO—($CH_2$)x—COOH, wherein 4≤x≤6, and wherein the siloxane polymer matrix comprises matrix siloxane polymers, with cross-links between one or more of (i) matrix siloxane polymers and (ii) matrix siloxane polymers and capping ligand siloxane polymers.

6. The wavelength converter according to claim 5, wherein x=6, wherein the capping group is a capping side group, and wherein the siloxane polymers have a Mw of at least 22 kg/mole.

7. The wavelength converter according to claim 5, wherein the capping ligands comprise siloxane capping ligands having x1 Si backbone elements, wherein the matrix siloxane polymers have y1 Si backbone elements, wherein x1 is at least 20, wherein y1 is at least 2, and wherein x1/y1≥0.8.

8. The wavelength converter according to claim 5, wherein the capping ligands comprise siloxane capping ligands having x1 Si backbone elements, wherein the siloxane polymer matrix comprises siloxane polymers of a first type and siloxane polymers of a second type, wherein at least part of the second type of siloxane polymers are cross-linked, wherein the siloxane polymers of the first type comprise short chain siloxane polymers having s1 Si backbone elements, wherein the siloxane polymers of the second type comprise siloxane polymers having y1 Si backbone elements, and wherein x1/s1≥0.8, s1<y1 and x1<y1.

9. The wavelength converter according to claim 5, wherein the wavelength converter nanoparticles comprise quantum dots.

10. A siloxane polymer capping ligand comprising at least one capping group R8 comprising a terminal carboxylic acid group, wherein the capping group comprises in total at least six carbon atoms and equal to or less than 20 carbon atoms, the siloxane polymer capping ligand having the formula:

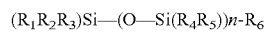

$(R_1R_2R_3)Si—(O—Si(R_4R_5))n-R_6$ wherein:
  $R_1, R_2, R_3, R_6$ are independently selected from the group consisting of H, OH, methyl, phenyl and $R_8$,
  $R_4, R_5$ are independently selected from the group consisting of methyl, phenyl and $R_8$, n≥1,
  $R_8$ comprises —($CH_2$)$_3$—$NH_2$, a≥1;
  $R_8$ comprises —($CH_2$)$_3$—NH—CO—($CH_2$)$_x$—COOH, wherein 4≤x≤6, and with the total number of capping groups $R_8$ in the siloxane polymer capping ligand selected from the range of ≥1 and ≤2n, and no more than in total 10 capping groups per siloxane polymer capping ligand.

11. The siloxane polymer capping ligand according to claim 10, wherein x=6.

12. The siloxane polymer capping ligand according to claim 10, wherein the siloxane polymer of the ligand has a Mw of at least 22 kg/mole.

13. A method for the production of a siloxane polymer capping ligand, comprising reacting a siloxane polymer having the formula:

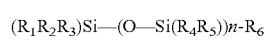

$(R_1R_2R_3)Si—(O—Si(R_4R_5))n-R_6$ wherein:
  $R_1, R_2, R_3, R_6$ are independently selected from the group consisting of H, OH, methyl, phenyl and $R_7$,
  $R_4, R_5$ are independently selected from the group consisting of methyl, phenyl and $R_7$, n≥1,
  $R_7$ comprises —($CH_2$)$_a$—$NH_2$, a≥1;
  the total number of groups $R_7$ in the siloxane polymer especially selected from the range of ≥1 and ≤2n, and no more than in total 10 amine groups per siloxane polymer;

with a molecule 6b-d, having the formula:

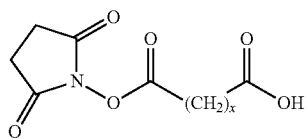

wherein x≥1.

14. A method for the production of a luminescent material, the method comprising:
(i) providing siloxane polymer capping ligands comprising siloxane polymers which comprise at least one capping group comprising a terminal carboxylic acid group, wherein the capping group comprises in total at least six carbon atoms, wherein the capping group comprises —$(CH_2)_3$—NH—CO—$(CH_2)_x$—COOH, and wherein 4≤x≤6;
(ii) providing wavelength converter nanoparticles with organic capping ligands associated to the wavelength converter nanoparticles; and
(iii) exchanging in an exchange process the organic capping ligands for the siloxane polymer capping ligands to provide said luminescent material.

15. A lighting device comprising:
a light source configured to generate light source light, one or more of: (i) a luminescent material comprising wavelength converter nanoparticles with siloxane polymer capping ligands associated to the wavelength converter nanoparticles, wherein the siloxane polymer capping ligands comprise siloxane polymers which comprise at least one capping group comprising a terminal carboxylic acid group, wherein the capping group comprises in total at least six carbon atoms, wherein the total number of carbon atoms in the capping group is equal to or less than 20 carbon atoms, wherein the capping group comprises —$(CH_2)_3$—NH—CO—$(CH_2)_x$—COOH, and wherein 4≤x≤6; and
(ii) a wavelength converter comprising a siloxane polymer matrix with the wavelength converter nanoparticles, the wavelength converter being configured to convert at least part of the light source light into visible converter light.

* * * * *